United States Patent [19]

Staviski

[11] Patent Number: 4,726,114

[45] Date of Patent: Feb. 23, 1988

[54] ELECTRICAL COMPONENT LEAD BENDING AND CUTTING APPARATUS

[76] Inventor: Theodore Staviski, 293 High Crest Dr., West Milford, N.J. 07480

[21] Appl. No.: 945,395

[22] Filed: Dec. 23, 1986

Related U.S. Application Data

[63] Continuation of Ser. No. 725,425, Apr. 22, 1985, Pat. No. 4,630,354.

[51] Int. Cl.[4] .............................................. H05K 3/32
[52] U.S. Cl. ..................................... 29/838; 29/566.3; 29/739; 140/105
[58] Field of Search ................. 29/566.1, 566.3, 566.4, 29/739, 741, 832, 834–839; 140/1, 93 D, 105, 106

[56] References Cited

U.S. PATENT DOCUMENTS

| | | | |
|---|---|---|---|
| 2,885,764 | 5/1959 | Shulters et al. | 29/566.1 X |
| 2,893,010 | 7/1959 | Stuhre | 140/1 |
| 3,427,849 | 2/1969 | Ainsworth et al. | 140/105 X |
| 3,986,533 | 10/1976 | Woodman, Jr. | 140/93 D X |
| 4,135,558 | 1/1979 | Ragard et al. | 140/105 |
| 4,165,557 | 8/1979 | Taguchi et al. | 140/105 X |
| 4,430,406 | 9/1983 | Foley | 140/93 D X |
| 4,513,493 | 4/1985 | Whitley et al. | 29/566.3 |
| 4,557,044 | 12/1985 | Crowman et al. | 140/105 X |
| 4,630,354 | 12/1986 | Staviski | 140/105 X |

Primary Examiner—Gil Weidenfeld
Assistant Examiner—Steven C. Bishop
Attorney, Agent, or Firm—John G. Gilfillan, III; Raymond J. Lillie

[57] ABSTRACT

A lead cutting and bending apparatus provided for bending component leads placed through a circuit board. The cutting mechanism of the invention uses concentric components operating in an axial mode.

1 Claim, 7 Drawing Figures

ELECTRICAL COMPONENT LEAD BENDING AND CUTTING APPARATUS

This is a continuation of application Ser. No. 725,425, filed Apr. 22, 1985, U.S. Pat. No. 4,630,354.

BACKGROUND OF THE INVENTION

1. Field of the Invention

This invention relates to devices for bending and cutting leads of electrical components such as resistors, capacitors, and the like. More particularly, this invention relates to a new and improved apparatus which will bend and cut the lead of a component with a minimum of mechanical effort through the use of simplified structure.

2. Description of the Prior Art

For the past several years, it has been the practice of the electronics industry to develop tools that permit automatic and semi-automatic assembly of circuit boards and their components. For example, there are devices which will automatically insert the proper component into the holes of a circuit board. Once this insertion has been completed, it may be necessary to trim the leads of the component and further insure that the component will remain fixed in the board. The latter can be achieved by bending the leads so as to cause interference between each lead and the circuit board hole.

One early cutting device comprises a cylinder having a bore containing a solid cutting member which travels in piston-like fashion within the bore. The cylinder has an opening at one end permitting one to insert a component lead into and through the bore, exiting the cylinder through an orifice on the cylinder wall. When the cutting member moves towards the opening of the bore, it interferes with the component lead, severing it at the orifice and the severed portion falls away from the cylinder. This type of apparatus is disclosed in U.S. Pat. Nos. 3,429,170; 3,593,404; and 4,286,379.

Lead cutters have also been designed to perform the cutting action in a radial direction. Some of these devices use concentric shearing means. These are exemplified by the arrangements shown in U.S. Pat. Nos. 3,414,024 and 4,153,082.

Numerous devices have been designed for bending leads of components after they have been inserted into a circuit board. In the vast majority of such devices, a force is applied in a direction perpendicular to the component lead causing interference between the lead and the circuit board hole through which the lead passes. Devices of these types may also be equipped to bend the portion of the lead extending below the plane of the circuit board. Exemplary devices are illustrated in U.S. Pat. Nos. 2,893,006; 3,141,492; 3,435,857; 3,907,008; 4,125,136; 4,464,829; and 4,485,548.

Although the devices noted above are capable of performing the cutting and bending operations required in electrical assembly, such devices are for the most part mechanically complex and require special driving means. As a result, changing of cutting surfaces or elements requires an involved procedure. Also, in certain configurations, the tool makes physical contact with the circuit board as it moves, possibly scoring the underside of the board. Finally, the devices themselves tend to be somewhat bulky and do not permit flexibility in operation and movement.

SUMMARY OF THE INVENTION

It is an object of the invention to provide an apparatus for lead bending and cutting which is mechanically simple.

It is a further object of the invention to provide an apparatus for lead bending and cutting which is easily assembled.

It is a further object of the invention to provide a lead bending and cutting apparatus which provides for easily changed cutting elements.

It is a further object of the invention to provide a lead bending and cutting apparatus that is compact.

It is a further object of the invention to provide a lead bending and cutting apparatus which requires minimal driving power.

It is a further object of the invention to provide a lead bending and cutting apparatus which provides improved operator safety.

It is a further object of the invention to provide a lead bending and cutting apparatus which has no moving parts that make contact with the printed circuit board.

It is a further object of the invention to provide a lead bending and cutting apparatus where the entire assembly can be moved in all directions to achieve a bending action or operation on the component leads.

These objects as well as others not enumerated are achieved by the invention, one embodiment of which may include a cylindrical housing having a cover with an off-center bore and a shaft rotatably received therein having an off-center bore located the same radial distance from its axis as the bore in the cylindrical housing cover, and adapted to shear a component lead inserted through the first and second bores when the internal shaft is rotated with respect to the cylindrical housing. Both the cylindrical housing and the rotatable internal shaft are provided with complimentary cuts relieving portions of both elements so that the severed portion of the lead may be discarded. Finally, a fiber optic element may be provided in the bore of the internal rotatable shaft for illuminating the hole or holes in the circuit board. This entire assembly is mounted for movement in the x-, y-, and z-direction to achieve bending of a component lead as required.

In operation, a lead is inserted into the first bore of the cylindrical housing and into the second bore of the rotatable internal shaft. The end of the lead extends outwardly from the housing through the relieved portions of the shaft and housing. The internal shaft is rotated, severing the lead at the point where the end of the internal shaft abuts the inside of the cover on the cylindrical housing, which is also the point where the first and second bores meet. When the severing operation occurs, the severed portion of the lead merely falls away from the assembly. Once the severing operation has been completed, the head is moved in a predetermined direction creating interference between the component lead and the circuit board hole through which the lead passes.

BRIEF DESCRIPTION OF THE DRAWING

A more complete understanding of the present invention, will become apparent upon consideration of the following detailed description, especially when considered in light of the accompanying drawings wherein.

DETAILED DESCRIPTION

Figure 1:
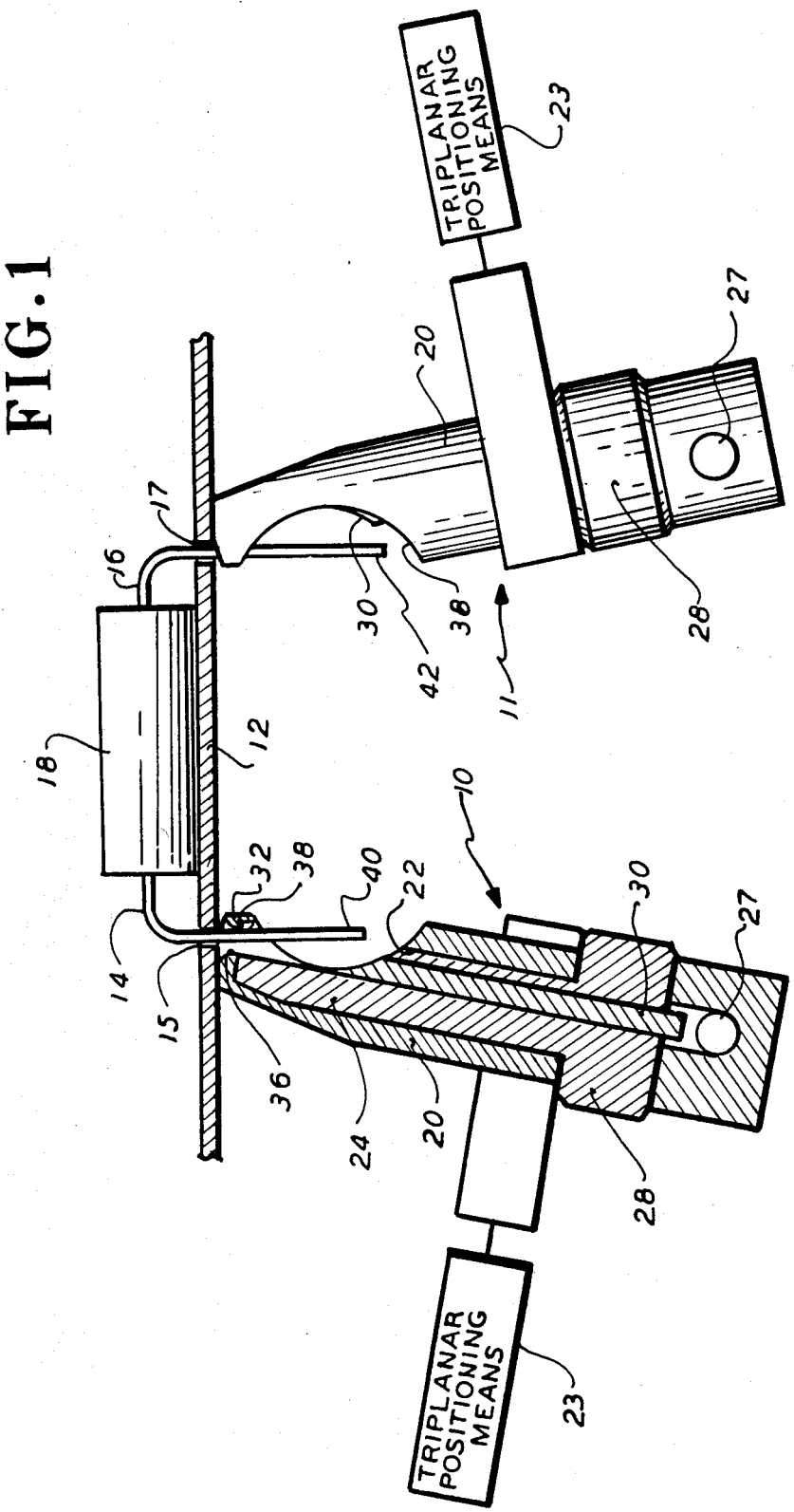
FIG. 1 is a modified sectional view of the invention.

As stated above this invention relates to bending and cutting devices. Referring therefore to FIG. 1, two bending and cutting devices structured in accordance with the teachings of the present invention as shown and designated generally by the reference numerals 10 and 11. Devices 10 and 11 are shown in side-by-side operating positions such as to be utilized to bend and cut leads 14 and 16 from opposite ends of a component 18, which leads extend through aperatures 15 and 17 formed in a circuit board 12 to which component 18 is to be operatively attached. Each such device 10, 11 has a three-degree-of-freedom (triplanar) positioning means 23 and 25, respectively. For example, one may use an x-y-z platform as a base for the bending and cutting devices 10, 11 such as are well known in the art. Bending and cutting apparatus 10 is shown generally in cross-section.

Each of bending and cutting devices 10, 11 includes cylindrical housing 20 which is slidably received over a rotatable member 24 and a light source 27 which cooperates with a fiber optic element 30. These component parts are shown in their assembled positions in FIG. 1. However, their structured details are best described with respect to FIGS. 2-5.

Figure 2:
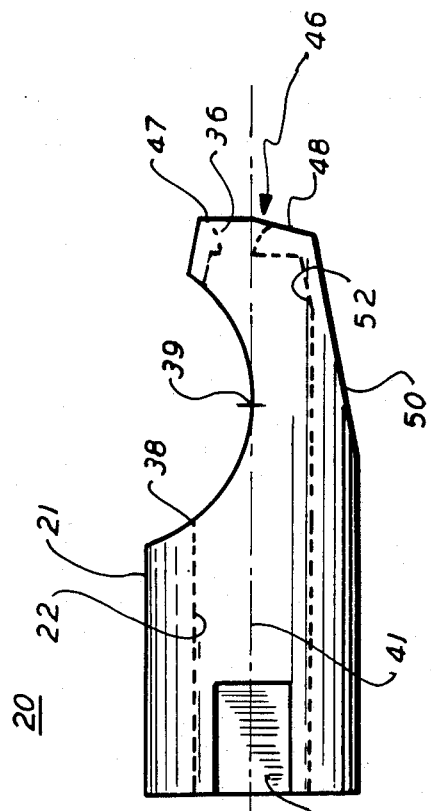
FIG. 2 is a plan view of the cylindrical housing.
Figure 3:
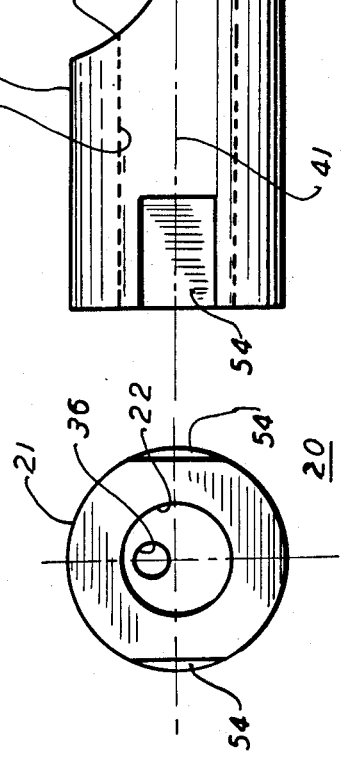
FIG. 3 is a first end view of the cylindrical housing.

Considering initially the structure of cylindrical housing 20, and with particular reference to FIGS. 2 and 3, housing 20 can be seen to comprise a generally cylindrical member having a bore 22 extending axially substantially throughout the entire length of the housing 20. Thus, bore 22 extends from the base of cylinder 20 to a location short of the insertion end 46 of the cylinder 20. The portion of bore 22 closest to insertion end 46 is tapered to define a frusto-conical surface 52 for cooperating with rotatable element 25 as is discussed below in detail.

Formed in insertion end 46 is a through-bore 36 the longitudinal axis of which is parallel to and radially displaced from the longitudinal axis of bore 22. The outer edge of through-bore 36 is provided with a radius to facilitate entry of a lead during operation of the device.

The outer surface 21 of cylinder 20 is relieved to define an arcuate cut 38, the surface of which is tangent at point 39 to the longitudinal axis of bore 22. Further, the center of generation of cut 38 is on a radius which is perpendicular to the longitudinal axis 41 of bore 22 and which contains point 39. As is discussed below, arcuate cut 38 corresponds to a similar cut formed in rotating element 24.

Figure 4:
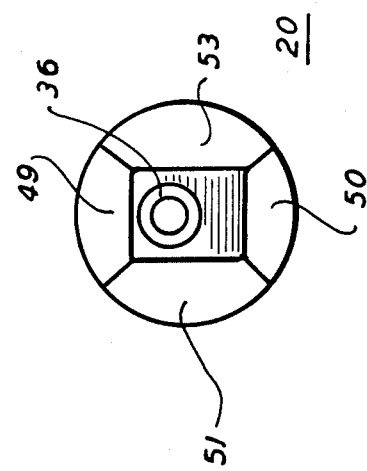
FIG. 4 is a second end view of the cylindrical housing.
Figure 6:
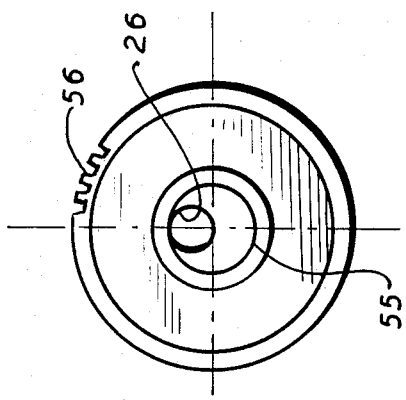
FIG. 6 is an end view of the rotatable internal shaft.

The outer surface 21 of cylindrical housing 20 is machined adjacent insertion end 46 to define four tapered flat surfaces 49, 50, 51 and 53 (FIG. 4). These tapered flats permit placing a plurality of devices 20 in due proximity for operation.

Formed adjacent the base of cylinder 20 are opposing flats 54 which cooperate to define surfaces suitable tooling or the like. The surface of insertion end 46 of cylinder 20 is provided with two bevels 47 and 48.

Figure 5:
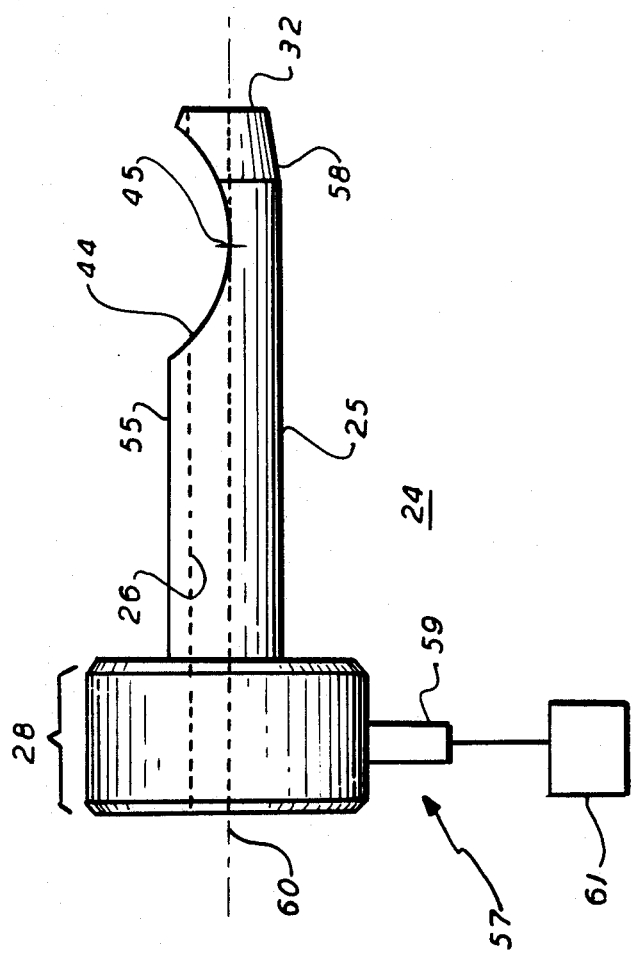
FIG. 5 is a plan view of the rotatable internal shaft.

As can be seen from FIG. 5, the rotatable element 24 has a shaft portion 25, a drive portion, and a contiguous cutting end 32. The cutting end 32 is machined with a frusto-conical taper 58 which cooperates with the frusto-conical surface 52 in the housing 20.

The shaft 26 has a radially-offset longitudinal bore 26 running throughout its length. As mentioned with regard to the housing 20, the outer surface 55 of rotatable element is relieved to define an arcuate cut 44, the surface of which is tangent at point 39 to the longitudinal axis 60 of the rotatable element 24. The center of generation of cut 44 is on a radius which is perpendicular to the longitudinal axis 60 of the rotatable element 24 and which contains point 45.

The drive portion 28 may be a gear 56 or a smooth surface which accepts a drive belt (not shown). If the gear 56 is chosen for the drive portion 28, there can be provided a rack and pinion arrangement 57 comprising the drive gear 56, a rack 59, and, for example, a drive operator 61 such an electric solenoid or air cylinder may be provided.

The operation of the bending and cutting device 10 can be understood by referring to FIG. 1. Initially, the bending and cutting devices 10 and 11 are positioned by the positioning means 23, 25 beneath the circuit board holes 15 and 17, respectively, such that the light emanating from the fiber optic cables is projected through the circuit board holes 15 and 17. This serves to indicate to the machine operator that the components should be inserted into the holes having illumination. The leads 14 and 16 of the component 18 are then inserted into the circuit board holes 15 and 17 and into the bending and cutting devices 10 and 11, respectively. Once in place, the internal shaft 24 is rotated with respect to the outer cylinder 20, severing the leads 14, 16 at the cutting end of the internal shaft 24. The severed portions of the leads 14, 16, free ends 40, 42, fall away from the bending and cutting device 10 and 11, exiting through the arcuate cut 38, 44. After the leads 14, 16 have been cut, the bending and cutting devices 10 and 11 are moved by the positioning means 23, 25 in accordance with the operator or machine instructions in a direction parallel to the surface of the circuit board 12, creating interference between the component leads 14 and 16 and the circuit board holes 15 and 17, respectively. Each device may be moved independently. Thus, they may move in tandem, towards each other, or apart. Further movement of the bending and cutting devices 10 and 11 causes the leads 14 and 16 to bend.

In an alternative embodiment, bending of the leads is performed by turning the entire assembly as a unit. Thus, the shaft 24 and the cylinder 20 would be rotated in unison. After the bending operation is complete, the shaft 24 is rotated relative to the cylinder 20, severing the lead.

Figure 7:
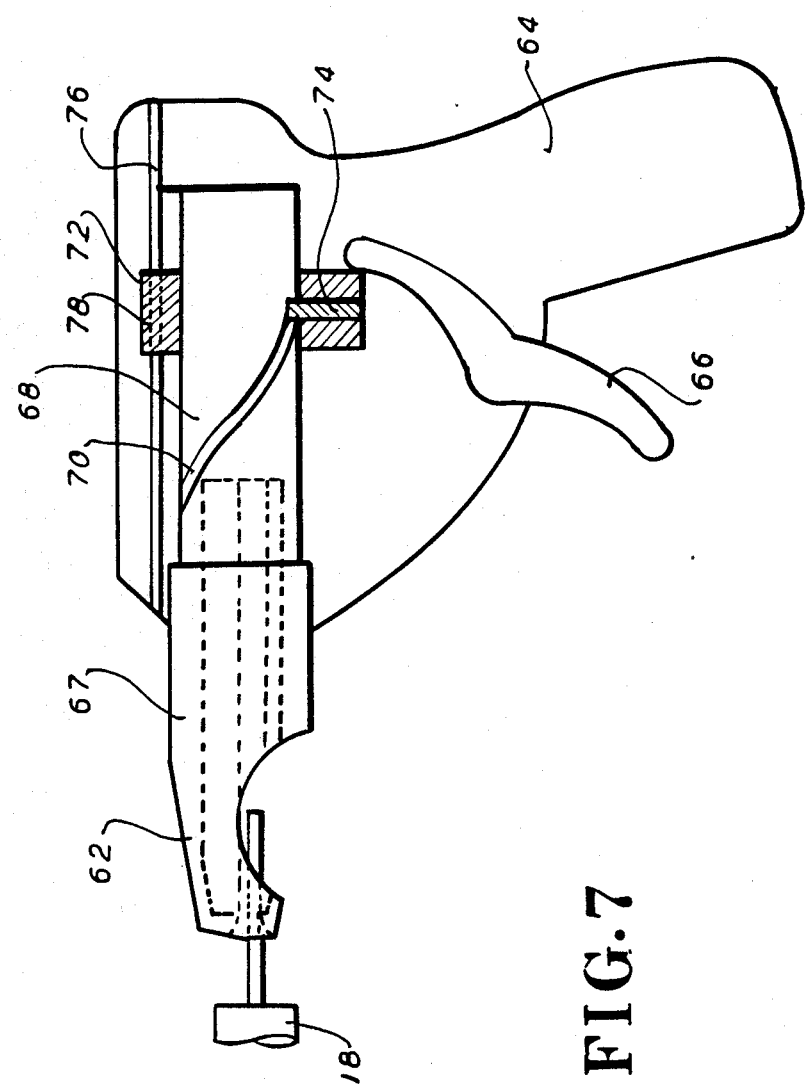
FIG. 7 is a modified sectional view of an alternative embodiment.

In addition to mounting the bending and cutting assemblies 10 and 11 on independent platforms movable in the x-, y-, and z-directions, it is also anticipated that this type of device could be mounted on a pistol grip, as can be seen in FIG. 7. In this embodiment, the cutting device 62 affixed to a pistol grip 64 which has a trigger 66. The cutting device 62 is provided with a rotatable element 67 having an extended shaft portion 68. Instead of a drive gear 56, the extended shaft portion 68 has a spiral thread 70. Riding the shaft portion 68 is a pin collar 72 having a drive pin 74 which cooperatively engages with the spiral thread 70. The pin collar 72 is stabilized by a guide rod 76 running through the guide rod bore 78 in the collar 72.

As pressure is placed on the trigger 64, the pin collar 72 is forced to move towards the cutting device 62. Because the guide rod 76 prevents the pin collar 72 from rotating about the extended shaft portion 68, the forward movement of the drive pin 74 against the spiral thread 70 forces the shaft portion 68 to rotate. The subsequent operation of the pistol arrangement is identical to that of the cutting devices 10 and 11.

It is important to note the structural simplicity of the lead bending and cutting device. Except for the drive and positioning means, the tool has only one moving part.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

I claim:

1. In a method for clinching at least one component lead, said component lead having an axis, and wherein said clinching is accomplished by utilizing a clinching apparatus comprising a rotatable element having an axis of rotation and a longitudinal offset bore;

a housing having an internal cavity which cooperatively receives said rotatable element, said rotatable element mounted within said housing for rotation about said axis of rotation, said housing having an entrance opening which communicates with said cavity and said bore when said rotatable element is positioned such that said bore and said opening are approximately adjacent to each other;

drive means for rotating said rotatble element to said housing by rotating said rotatble element until said bore and entrance opening are adjacent to each other, the improvement comprising:

positioning said clinching apparatus such that said bore and said opening are approximately adjacent to each other;

inserting said lead in said entrance opening and into said longitudinal offset bore; and moving said clinching apparatus in a direction transverse to said axis a predetermined distance until said lead is clinched.

* * * * *